US008304333B2

(12) United States Patent
Ramin et al.

(10) Patent No.: US 8,304,333 B2
(45) Date of Patent: Nov. 6, 2012

(54) METHOD OF FORMING A HIGH-K GATE DIELECTRIC LAYER

(75) Inventors: Manfred Ramin, Austin, TX (US); Michael F. Pas, Richardson, TX (US); Husam Alshareef, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 72 days.

(21) Appl. No.: 12/886,863

(22) Filed: Sep. 21, 2010

(65) Prior Publication Data
US 2011/0006375 A1    Jan. 13, 2011

Related U.S. Application Data

(62) Division of application No. 11/741,476, filed on Apr. 27, 2007, now Pat. No. 7,799,669.

(51) Int. Cl.
*H01L 21/3205*   (2006.01)
*H01L 21/8238*   (2006.01)
(52) U.S. Cl. .................. 438/591; 438/199; 438/786
(58) Field of Classification Search .......... 257/197, 257/199, 240, 591, 786, E21.625, E21.639
See application file for complete search history.

(56) References Cited

U.S. PATENT DOCUMENTS

| 6,531,354 | B2 | 3/2003 | Maria et al. | |
|---|---|---|---|---|
| 7,087,483 | B2 | 8/2006 | Huang et al. | |
| 7,291,526 | B2 * | 11/2007 | Li | 438/197 |
| 7,923,336 | B2 * | 4/2011 | Lee et al. | 438/287 |
| 2005/0181607 | A1 * | 8/2005 | Aoyama | 438/675 |
| 2006/0131672 | A1 | 6/2006 | Wang et al. | |

OTHER PUBLICATIONS

Chen et al., "Yb-Doped Ni FUSI for the n-MOSFETs Gate Electrode Application", IEEE Electron Device Letters, vol. 37, No. 3, Mar. 2006, pp. 160-162.
Narayanan et al., "Band-Edge High-Performance High-K/Metal Gate n-MOSFETs using Cap Layers Containing Group IIA and IIIB Elements with Gate-First Processing for 45nm and Beyond", 2006 Symposium on VLSI Technology Digest of Technical Papers.
Alshareef, et al., "Thermally Stable N-Metal Gate MOSFETs Using La-Incorporated HfSiO Dielectric", 2006 Symposium on VLSI Technology Digest of Technical Papers.

* cited by examiner

*Primary Examiner* — Hung Vu
(74) *Attorney, Agent, or Firm* — Warren L. Franz; Wade J. Brady, III; Frederick J. Telecky, Jr.

(57) ABSTRACT

A method for manufacturing a semiconductor device includes forming a gate electrode over a gate dielectric. The gate dielectric is formed by forming a lanthanide metal layer over a nitrided silicon oxide layer, and then performing an anneal to inter-diffuse atoms to form a lanthanide silicon oxynitride layer. A gate electrode layer may be deposited before or after the anneal. In an embodiment, the gate electrode layer includes a non-lanthanide metal layer, a barrier layer formed over the non-lanthanide metal layer, and a polysilicon layer formed over the barrier layer. Hafnium atoms may optionally be implanted into the nitrided silicon oxide layer.

11 Claims, 5 Drawing Sheets

METHOD OF FORMING A HIGH-K GATE DIELECTRIC LAYER

This application is a division of prior application Ser. No. 11/741,476, filed Apr. 27, 2007, the entirety of which is hereby incorporated by reference.

BACKGROUND

The disclosure is directed, in general, to a method of manufacturing semiconductor devices, and more specifically, to a method of manufacturing a gate dielectric layer.

There is a push in the semiconductor industry towards semiconductor devices (e.g., metal-oxide semiconductor, MOS, transistor devices) that have gate electrodes with different work functions and a gate dielectric layer having a high dielectric constant (e.g., dielectric constant, k, of greater than 4). Unfortunately, the existing candidate high-k dielectric layers have a number of problems. The problems include poor reliability, channel mobility degradation, insufficiently high k value, and contamination issues, depending on the precursor used.

Accordingly, what is needed is a material and method for fabricating high-k gate dielectric layer that addresses the drawbacks of the prior art methods and devices.

SUMMARY

One aspect of the disclosure is a method for manufacturing a semiconductor device. In one embodiment, the method comprises forming a dielectric layer. Forming the dielectric layer includes depositing a silicon oxide layer on a semiconductor substrate, nitriding the silicon oxide layer to form a nitrided silicon oxide layer and incorporating lanthanide atoms into the nitrided silicon oxide layer to form a lanthanide silicon oxynitride layer. In another embodiment, forming the dielectric layer includes implanting hafnium atoms into the nitrided silicon oxide layer to form a hafnium silicon oxynitride layer.

In still another embodiment, the method comprises forming a transistor, including forming a gate dielectric layer including forming the above-described nitrided silicon oxide layer, depositing a lanthanide metal layer on the nitrided silicon oxide layer and thermally annealing the lanthanide metal layer and the nitrided silicon oxide layer to form a lanthanide silicon oxynitride layer. Forming the transistor also includes forming a gate electrode including depositing a non-lanthanide metal layer on the gate dielectric layer, depositing a barrier layer on the non-lanthanide metal layer, and depositing a polysilicon layer on the barrier layer. Forming the transistor further includes patterning the lanthanide silicon oxynitride layer and the gate electrode.

In yet another embodiment, the method comprises forming a transistor, including forming a gate dielectric layer, including forming the above-described nitrided silicon oxide layer, implanting lanthanide atoms into the nitrided silicon oxide layer and thermally annealing the lanthanide-implanted nitrided silicon oxide layer to form a lanthanide silicon oxynitride layer. Forming the transistor also includes forming a gate electrode, including depositing a polysilicon layer on the nitrided silicon oxide layer. Forming the transistor also includes patterning the polysilicon layer and the nitrided silicon oxide layer. Implanting the lanthanide atoms is performed after depositing the polysilicon layer, and after patterning the polysilicon layer and the nitrided silicon oxide layer.

Another aspect of the disclosure is a semiconductor device. The device comprises one or more nMOS transistors and one or more pMOS transistors on or in the semiconductor substrate. The nMOS transistors include a gate dielectric layer on the substrate, a gate electrode on the gate dielectric layer, and source and drain structures adjacent to the gate dielectric layer. The gate dielectric layer consists essentially of a lanthanide silicon oxynitride layer. The pMOS transistors include a second gate dielectric layer on the substrate, a second gate electrode on the gate dielectric layer, and second source and drain structures adjacent to the gate dielectric layer. The second gate dielectric layer is substantially lanthanide-free. The device also comprises insulating layers over the nMOS transistors and pMOS transistors, and interconnects in the insulating layers. The interconnects electrically couple the nMOS and the pMOS transistors.

BRIEF DESCRIPTION OF DRAWINGS

The disclosure is described with reference to example embodiments and to accompanying drawings, wherein.

DETAILED DESCRIPTION

This disclosure benefits from the realization that incorporating lanthanides into a nitrided silicon oxide layer allows the formation of a thick high-k gate dielectric layer with low electrical thickness. This, in turn, improves semiconductor device performance (e.g., increases the source-to-drain current) and has lower off-state current while not degrading the long channel threshold voltage of the device. Additionally, the ability to implant lanthanides or hafnium, as disclosed herein, facilitates the fabrication of the high-k gate dielectric layer in selected devices (e.g., nMOS transistors but not pMOS transistors).

Figure 1:
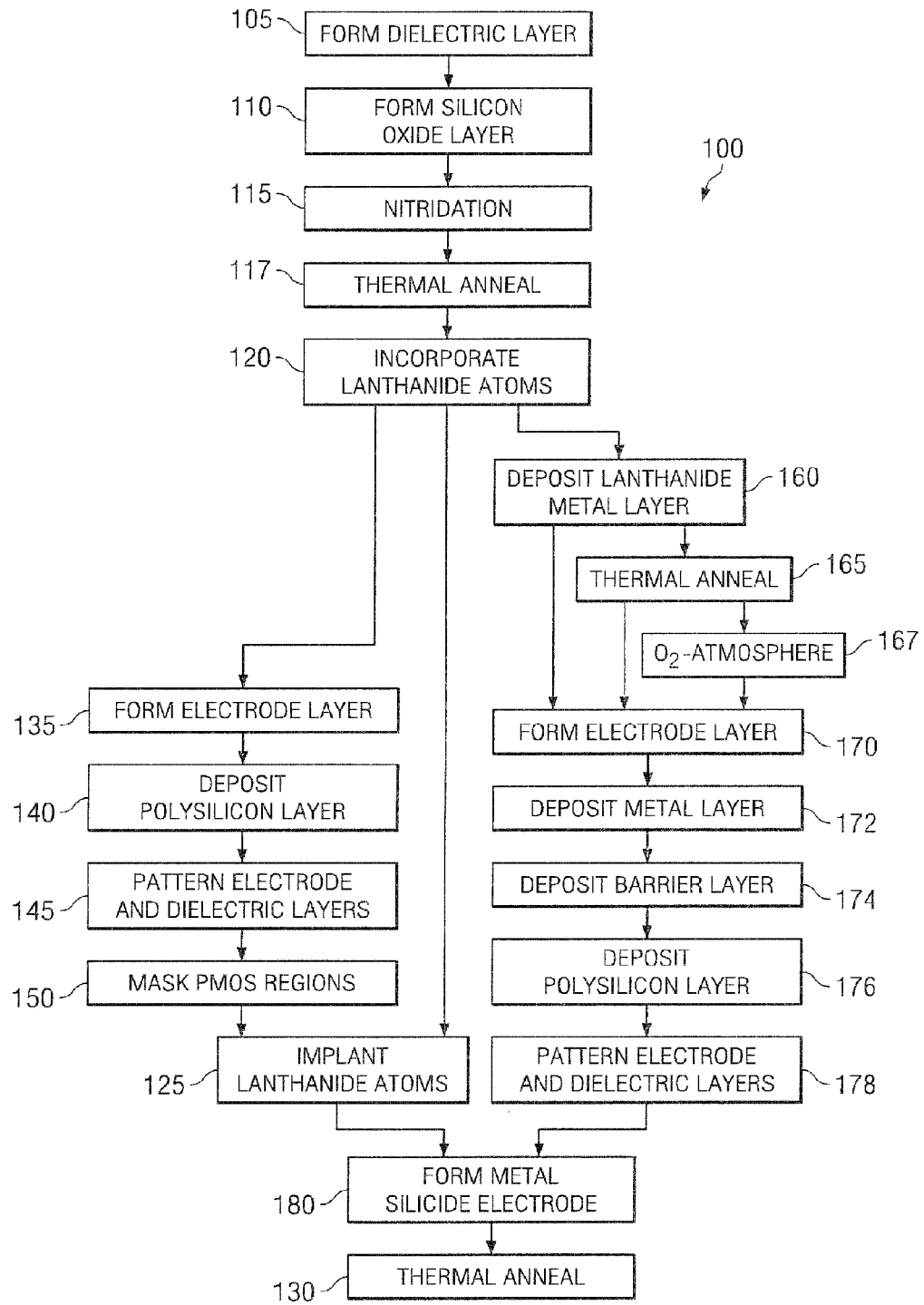
FIG. 1 presents a flow diagram of example methods of manufacturing a semiconductor device of the present disclosure.

FIG. 1 presents a flow diagram of example methods 100 of manufacturing a semiconductor device of the present disclosure. The method 100 comprises forming a dielectric layer (step 105). Forming the dielectric layer includes depositing a silicon oxide layer on a semiconductor substrate (step 110). Forming the dielectric layer also includes nitriding the silicon oxide layer to form a nitrided silicon oxide layer (step 115). Forming the dielectric layer further includes incorporating lanthanide atoms (e.g., ytterbium, gadolinium or dysprosium or other atoms of the lanthanide series of elements) into the nitrided silicon oxide layer to form a lanthanide silicon oxynitride layer (step 120).

Depositing the silicon oxide layer in step 110 can include the spontaneous oxidation of the upper surface of the substrate, e.g., the oxidation of a silicon substrate after a dilute hydrofluoric acid wet clean and water rinse. Depositing the silicon oxide layer (step 110) can also include in situ steam generation of silicon oxide. Nitriding in step 115 can include exposing the silicon oxide layer to a remote or decoupled nitrogen plasma to implant the silicon oxide layer with a high concentration of nitrogen atoms (e.g., about 6 to 20 atomic percent in the nitrided silicon oxide layer). Other methods, such as $NH_3$ thermal nitriding, could be used to nitride the silicon oxide layer in step 115. In some cases the nitriding (step 115) further includes a thermal anneal step 117 (e.g., at about 1000° C. for about 60 seconds in an $N_2$ atmosphere) to facilitate the distribution of the nitrogen atoms throughout the silicon oxide layer.

In some embodiments, incorporating the lanthanide atoms in step 120 includes implanting lanthanide atoms into the nitrided silicon oxide layer (step 125) and then thermally annealing the lanthanide-implanted nitrided silicon oxide layer (step 130).

As illustrated in FIG. 1, implanting according to step 125 can be performed after forming, in step 135, an electrode layer (e.g., transistor gate electrode layer) of the semiconductor device. Forming the electrode layer (step 130) can include depositing a polysilicon layer on the nitrided silicon oxide layer in step 140. The lanthanide atom implantation (step 125) can be done after depositing the polysilicon layer (step 140). Chemical vapor deposition (CVD), physical vapor deposition (PVD), atomic layer deposition (ALD), atomic vapor deposition (AVD) or other conventional methods can be used to deposit the polysilicon layer in step 140. In some cases, as illustrated in FIG. 1, the implantation of the lanthanide atoms according to step 125 can also be performed after patterning, in step 145, the electrode layer (e.g., the polysilicon layer) and the dielectric layer. E.g., a reactive ion dry etch can be performed to accomplish the patterning step 145.

In some cases, the implantation energy and dose of lanthanide atoms used in the implanting step 125 is carefully controlled to optimize the implanting of the lanthanide atoms through the electrode layer (e.g., the polysilicon layer) and into the nitrided silicon oxide layer. Consider embodiments where the overlying polysilicon layer is about 70 to 90 nm thick. In such embodiments, implanting the lanthanide atoms in step 125 can include an implantation energy of about 20 to 40 keV, and a lanthanide atom dose ranging from about 5E14 to 5E15 atoms/cm$^2$, depending on the thickness of the polysilicon layer. In some embodiments, when the polysilicon layer is about 80 nm thick, ytterbium is implanted at an energy ranging from about 35 keV and a dose ranging from about 3E15 to 5E15 atoms/cm$^2$. Those skilled in the art would understand how the lanthanide atom dose and implantation energy could be adjusted if, e.g., a polysilicon layer of different thickness were deposited in step 140, or if the lanthanide atoms were implanted before forming the electrode layer.

The use of lanthanide atom implantation, such as described for step 125, can facilitate the selective incorporation of lanthanide atoms into selected active devices of the semiconductor device but not into other active devices. This can be advantageous in cases where the presence of lanthanide atoms in a gate dielectric layer could change the work function of the gate electrode to an undesirable value. E.g., as shown in FIG. 1, pMOS transistors can be masked (i.e., covered), in step 150, with a photoresist layer to prevent the implantation of lanthanides into the gate dielectric layer of the pMOS transistor. Consequently, the lanthanide atoms can be selectively implanted, in step 125, into the gate dielectric layers located in nMOS transistors of the semiconductor device.

In some embodiments, instead of, or in addition to, implanting lanthanides, hafnium atoms can be implanted into the nitrided silicon oxide layer to form a hafnium silicon oxynitride layer. Hafnium atoms can be implanted in analogous fashion, and at similar stages of the manufacturing process, as discussed above in the context of steps 125 to 150 (FIG. 1). E.g., in some cases, after an about 80 nm thick polysilicon layer is deposited in accordance with step 140, hafnium atoms can be implanted using a dose ranging from about 5E14 to 5E15 atom/cm$^2$ and using an implantation energy ranging from about 20 to 40 keV.

In addition to diffusing the implanted lanthanide atoms throughout the nitrided silicon oxide, the thermal annealing step 130 can also be configured as a spike anneal to activate and diffuse implanted source and drain dopants, or other implanted dopants (e.g., dopants implanted into the polysilicon layer) or to diffuse other atoms (e.g., metal atoms, such as nickel, subsequently deposited on the polysilicon layer). E.g., when also configured as a spike anneal, the thermal anneal step 130 can comprise heating from 1000 to 1100° C. for about 0.5 to 5 seconds.

In other embodiments, incorporating the lanthanide atoms in step 120 includes depositing a lanthanide metal layer in step 160 on the nitrided silicon oxide layer (formed in step 115), and then thermally annealing the lanthanide metal layer and the nitrided silicon oxide layer (e.g., using one or both of step 130 or step 165).

Depositing the lanthanide metal layer in step 160 can be accomplished using any conventional process including CVD, PVD, ALD or AVD. In some cases, the lanthanide metal layer (e.g., a Yb layer) is deposited via PVD at a rate that is slow enough (e.g., about 0.5 to 1 nm per second) to facilitate providing a final uniform thickness of the lanthanide metal layer over the entire nitrided silicon oxide layer (e.g., 0.5 to 2 nm±10%).

The thermal anneal is configured to inter-diffuse the atoms of the lanthanide metal layer with the atoms of the nitrided silicon oxide layer. In some cases, the thermal anneal can be the same as the above-described spike anneal step 130 that is configured to activate and diffuse implanted source and drain dopants, or other implanted dopants. E.g., as shown in FIG. 1, after depositing the lanthanide metal layer in step 160, an electrode (e.g., transistor gate electrode) can be formed in step 170 before performing the thermal anneal step 130.

In other cases, a separate thermal anneal step 165 can be performed immediately after (e.g., with no intervening device manufacturing steps) depositing the lanthanide metal layer (step 160). Some embodiments of the immediate thermal anneal (step 165) comprise heating to about 1000° C. for about 60 seconds. Some embodiments of the thermal anneal step 165 further include a step 167 of performing the anneal in an atmosphere having, for example, 1 to 10 percent oxygen ($O_2$), and a balance of nitrogen ($N_2$) or another inert gas. Some embodiments of the thermal anneal step 165 further include a step 167 of performing the anneal in an atmosphere having about 5 percent or higher oxygen ($O_2$), and a balance of nitrogen ($N_2$) or another inert gas. The inclusion of about 5 percent or higher oxygen in the anneal facilitates the covalent bonding of the lanthanide atoms to other atoms of the dielectric layer (e.g., lanthanide-oxygen-silicon bonds). Such bonding helps to keep the lanthanide atoms in the dielectric layer. E.g., during the immediate thermal anneal step 165, or subsequent spike thermal anneal step 130, the lanthanide atoms are thereby less likely to diffuse from the gate dielectric layer into the underlying substrate.

As also shown in FIG. 1, after depositing the lanthanide metal layer (step 160), an electrode layer can be formed in step 170. Forming the electrode (step 170) can include a step 172 of depositing a non-lanthanide metal layer on the dielectric layer. E.g., on the lanthanide silicon oxynitride layer, or on the lanthanide metal layer, in cases where the thermal anneal step 165 is not done. The non-lanthanide metal layer (about 5 to 10 nm thick) can be configured to provide the desired work function for the gate electrode of an active device that has the dielectric layer. E.g., the metal layer can be tungsten in pMOS transistors or tantalum carbide in nMOS transistors. Forming the electrode (step 170) can also include depositing a barrier layer in step 174 (e.g., titanium nitride or tantalum nitride) and depositing a polysilicon layer in step 176. The barrier layer helps to prevent the diffusion of atoms between the metal layer and the polysilicon layer. The polysilicon layer can be deposited using the same type of methods as used to deposit the polysilicon layer in step 140. Forming the electrode layer (step 170) can also include patterning the electrode and gate dielectric layers in step 178, similar to that described above for step 145.

Forming the electrode in either of steps 135 or 170 can further include forming a metal silicide electrode in step 180 to further adjust the work function of the electrode. E.g., a refractory metal, such as nickel, can be deposited by conventional means (e.g., a PVD process) on the polysilicon layer deposited in steps 140 or 176 and then thermally annealed (step 130) to form the metal silicide electrode.

Figure 2:
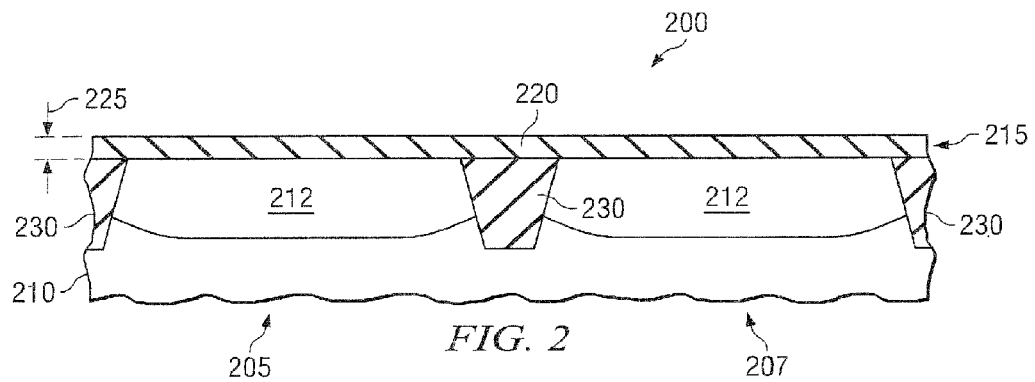
FIGS. 2-10 show cross-sectional views, at selected stages of manufacture, of an example semiconductor device according to the principles of the present disclosure.

To further illustrate aspects of the method discussed in FIG. 1, FIGS. 2-10 show cross-sectional views of an example semiconductor device 200, at selected stages of manufacture. The method includes forming one or more active devices 205, 207 (e.g., transistors) in or on a semiconductor substrate 210 (e.g., a silicon wafer or silicon layer grown on a silicon-germanium or other semiconducting substrate). As illustrated, the substrate 210 can have a doped well 212. Forming the active devices 205, 207 includes forming a dielectric layer 215 (e.g., a transistor gate dielectric layer). FIG. 2 shows the dielectric layer 215 after depositing a silicon oxide layer 220 on the semiconductor substrate 210 (step 105). In some embodiments, the silicon oxide layer 220 has a thickness 225 of about 2 to 3 nm. As further illustrated in FIG. 2, different active device 205, 207 can be electrically isolated from each other via an insulating structure 230 (e.g., field oxide or shallow trench isolation structures).

Figure 3:
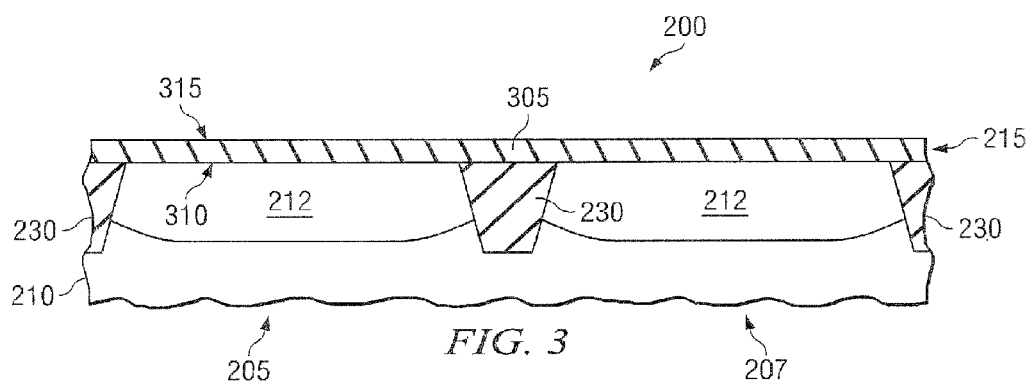

FIG. 3 shows the device 200 of FIG. 2 after nitriding the silicon oxide layer 220 (FIG. 2) to form a nitrided silicon oxide layer 305 (step 110). The formation of a nitrided silicon oxide layer is counterintuitive when the goal is to form a high-k dielectric layer. It is counterintuitive because the dielectric constant of nitrided silicon oxide layers is lower than for certain metal silicates such as hafnium silicate. It is only after incorporating lanthanide atoms into the nitrided silicon oxide layer that a high-k lanthanide silicon oxynitride layer can be obtained.

In some embodiments, a surface 310 of the nitrided silicon oxide layer 305 that is adjacent the substrate 210 has a lower nitrogen content than an opposing surface 315 of the layer 305. E.g., there is a gradient of higher to lower nitrogen content from the opposing surface 315 to the adjacent surface 310. Having lower amounts of nitrogen adjacent to the substrate 210 is desirable because excessive amounts of nitrogen (e.g., about 20 atomic percent or higher) can reduce the charge carrier mobility in the active devices 205, 207.

Figure 4:
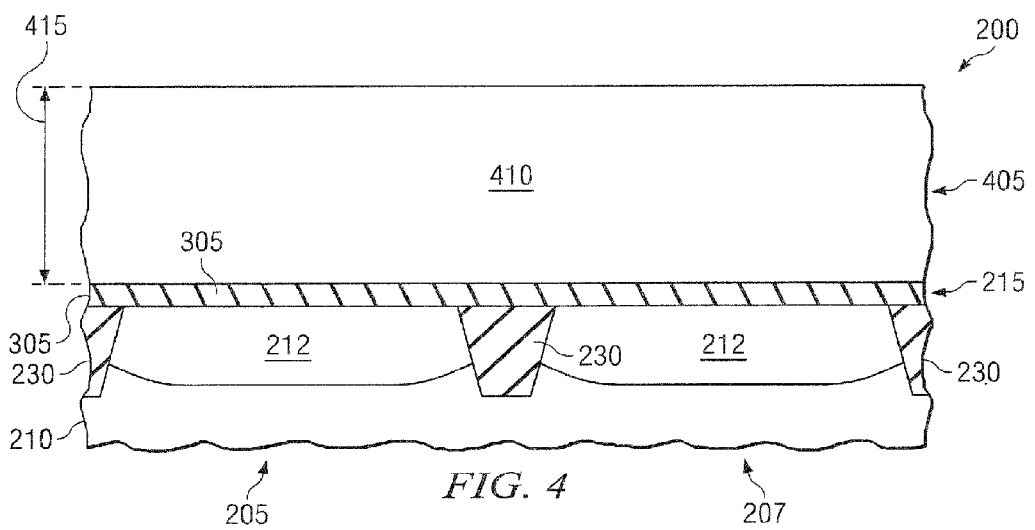

FIG. 4 shows the device 200 of FIG. 3 after forming an electrode layer 405 (e.g., transistor gate electrode) in step 135, including depositing a polysilicon layer 410 on the nitrided silicon oxide layer 305 (step 140). In some embodiments, the polysilicon layer has a thickness 415 of about 70 to 90 nm.

Figure 5:
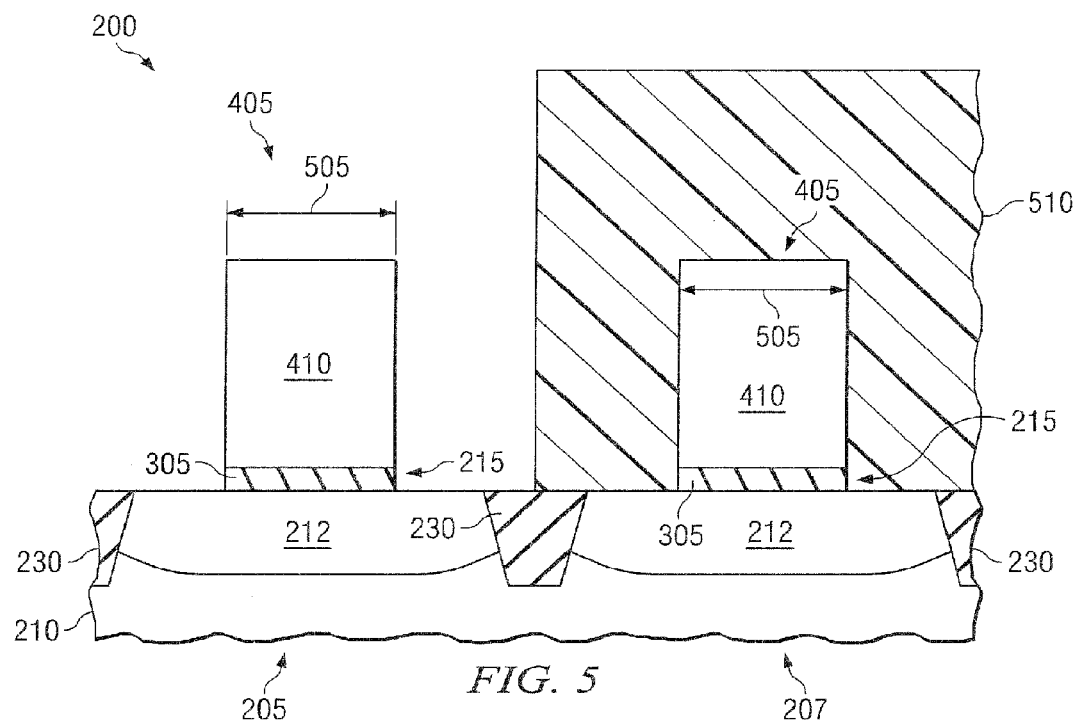

FIG. 5 shows the device 200 of FIG. 4 after patterning both the polysilicon layer 410 and the nitrided silicon oxide layer 305 according to step 145. In some embodiments, the gate length 505 is about 50 to 90 nm. As further illustrated in FIG. 5, selected active devices 207 (e.g., with one or more pMOS transistor) on the substrate 210 can be covered, with a mask layer 510 (e.g., a photoresist layer) to prevent the subsequent implantation of lanthanide atoms into the polysilicon layer 410 and the nitrided silicon oxide layer 305. The unmasked, or uncovered, active devices 205 (e.g., active devices having one or more nMOS transistor) can thereby be selectively implanted with lanthanide atoms.

Figure 6:
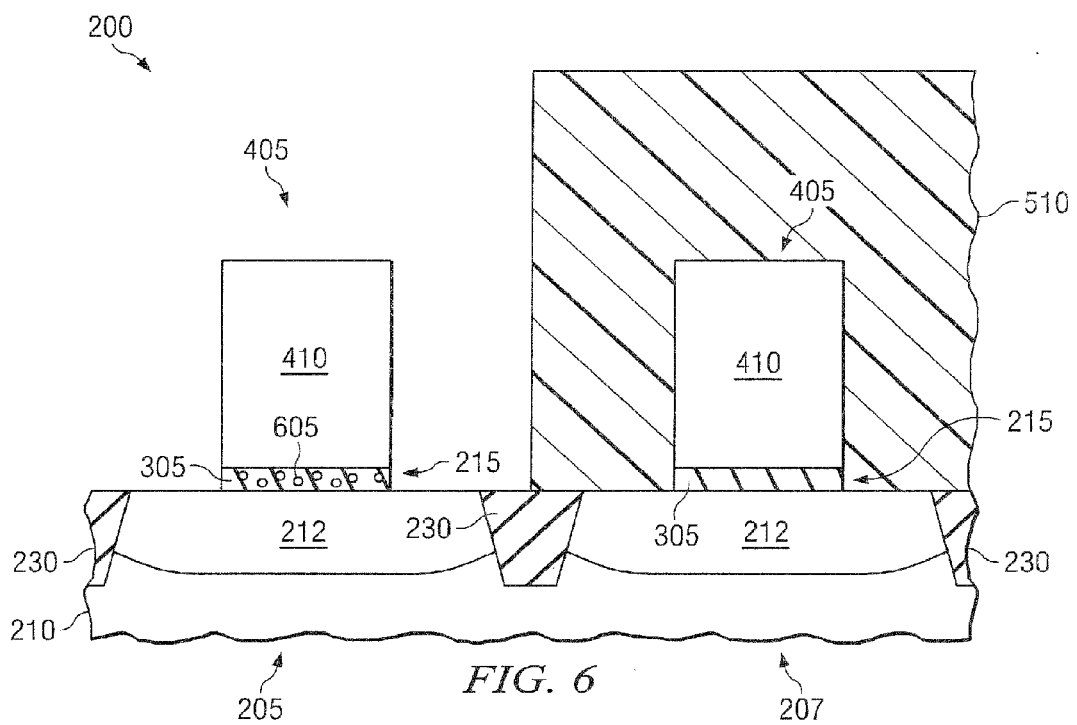

FIG. 6 shows the device 200 in FIG. 5 after performing additional steps to form the transistor gate dielectric layer 215. FIG. 6 shows the transistor gate dielectric layer 215 after incorporating (step 120) lanthanide atoms 605 (or, in some cases, hafnium atoms) into the nitrided silicon oxide layer 305 by implanting the lanthanide atoms 605 according to step 125. As illustrated, in some embodiments, the lanthanide atoms 605 are selectively implanted into the nitrided silicon oxide layer 305 of certain active devices 205, but not other active devices 207.

As illustrated in FIGS. 4-6, implantation with lanthanide atoms 605 can be performed after depositing the polysilicon layer 410, and after patterning both the nitrided silicon oxide layer 305 and the polysilicon layer 410. In other embodiments, however, lanthanide atoms 605 could be implanted before patterning these layers 305, 410, or before depositing the gate electrode 405, including the polysilicon layer 410.

Figure 7:
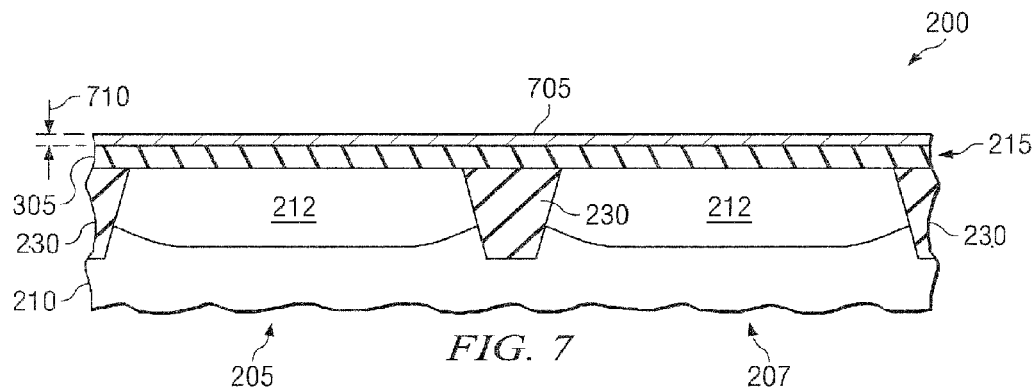
Figure 8:
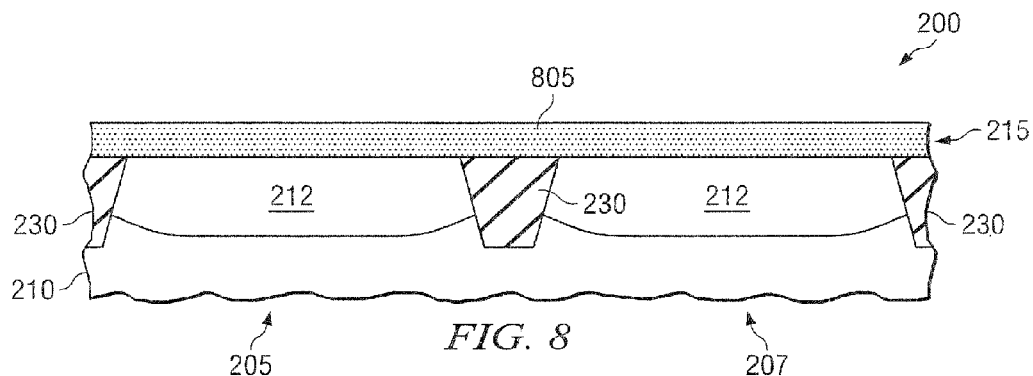

FIGS. 7-8 illustrate an alternative embodiment of the method where lanthanide atoms are incorporated by a process that includes depositing a lanthanide metal layer. FIG. 7 shows the device 200 of FIG. 3 after depositing a lanthanide metal layer 705 (step 160) on the nitrided silicon oxide layer 305. In some embodiments the lanthanide metal layer 705 has a thickness 710 of about 0.5 to 2 nm. In some cases, the lanthanide metal layer 705 is substantially free of oxides (e.g., less than about 1 atom percent oxygen atoms). The deposition of the metal layer 705 is an advantage because the layer 705 can be encapsulated in silicon before leaving a deposition chamber, and thereby prevent the metal layer 710 from being converted into a lanthanide oxide. This is desirable in cases where dielectric layer 215 comprising lanthanide oxide would undesirably lower the work function of the gate electrode. In other cases, however, it is desirable to implant discrete amounts of oxygen atoms into the lanthanide metal layer 705 to facilitate such work function adjustment.

FIG. 8 shows the device 200 of FIG. 7 after thermally annealing (step 165) the lanthanide metal layer 705 and the nitrided silicon oxide layer 305 (FIG. 7) to form a lanthanide silicon oxynitride layer 805. In some cases, thermal annealing is done in an oxygen atmosphere (e.g., about 5 percent or higher $O_2$ and balance $N_2$) in accordance with step 167. As discussed above in the context of FIG. 1, however, in other cases a thermal anneal (e.g., step 130) is be performed after forming an electrode layer (e.g., a transistor gate electrode).

Figure 9:
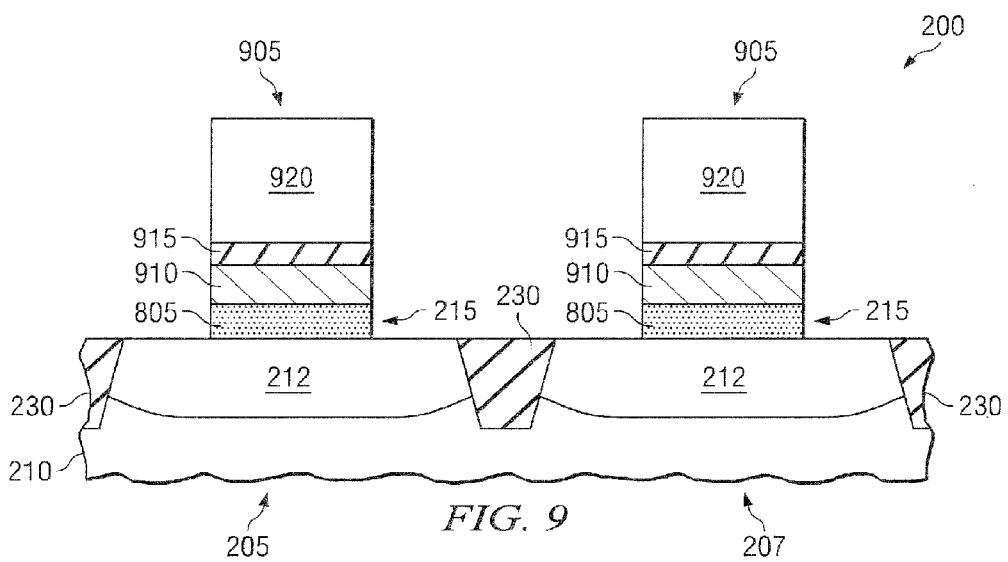

In some cases, forming the electrode layer comprises depositing a polysilicon layer and patterning the gate dielectric layer and electrode layer similar to that discussed above in the context of FIGS. 4 and 5. In other cases, such as illustrated in FIG. 9, forming the electrode layer 905 (step 170) includes depositing a non-lanthanide metal layer 910 on the transistor gate dielectric layer. The metal layer 910 can be deposited on either the lanthanide silicon oxynitride layer 805 of FIG. 8, or the lanthanide metal layer 705 of FIG. 7, depending on whether a thermal anneal has already been done. Forming the electrode layer 905 can also include depositing a barrier layer 915 (step 174), and depositing a polysilicon layer 920 (step 176). FIG. 9 also shows the electrode layer 905 and dielectric layer 215 after been patterned in accordance with step 178.

Figure 10:
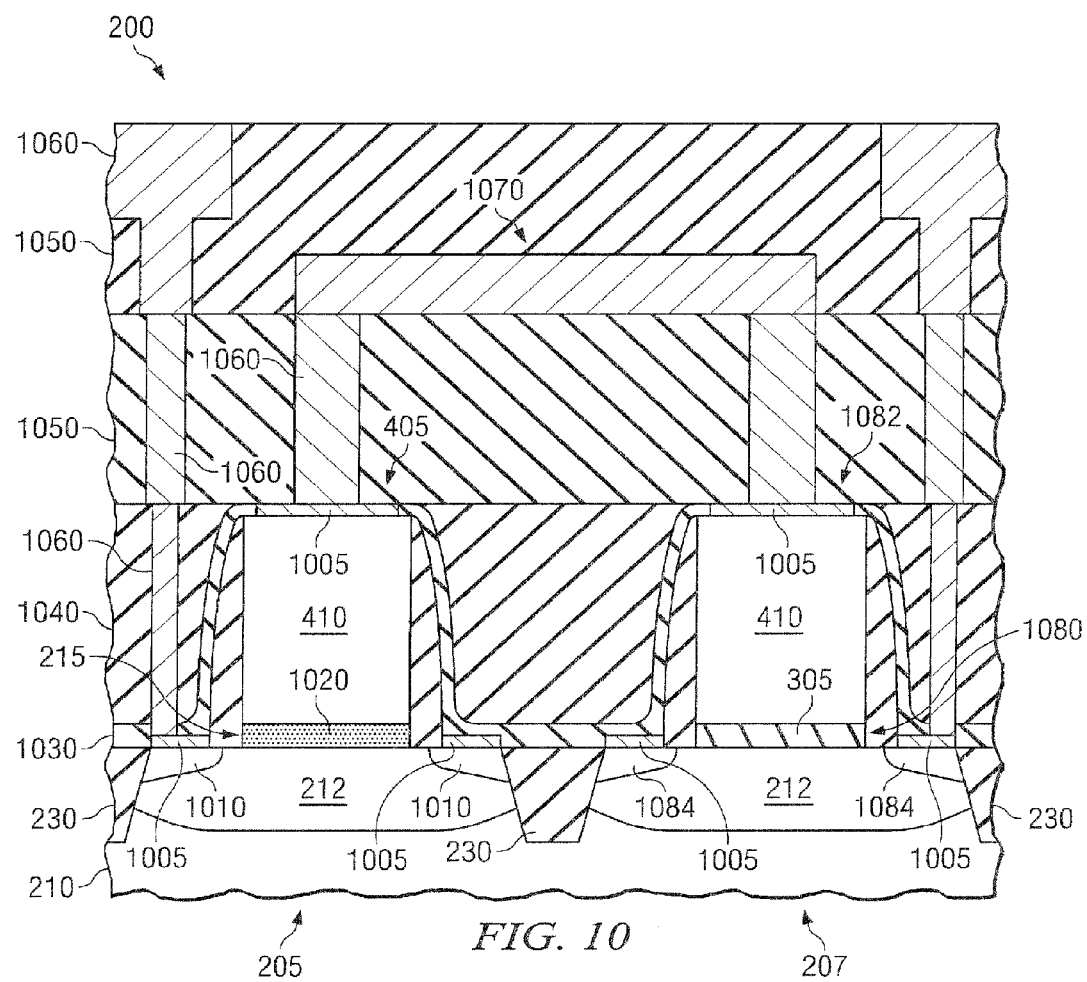

One skilled in the art would appreciate that there can be multiple additional manufacturing steps to complete the fabrication of the device 200. E.g., as illustrated in FIG. 10, for embodiments of the device 200 shown in FIG. 6, configured as an integrated circuit, the method can include conventional steps to remove the mask layer 510, implant dopants to form source and drain structures 1010, and to form metal silicide electrodes 1005 on the source and drain structures 1010 and on the gate electrode 405. The source and drain structures 1010 can be constructed so as to impart strain on portions of the substrate 210 below the gate dielectric layer 215, and thereby improve carrier mobility in the substrate 210. As discussed above in the context of FIG. 1, in some cases a spike thermal anneal (step 130) can be performed at this stage in the process to, among other things, diffuse the implanted lanthanide atoms 605 (FIG. 6) to thereby form a lanthanide silicon oxynitride layer 1020. The spike thermal anneal can also diffuse and activate the dopants of the source and drain structures 1010, and facilitate metal silicide electrode formation.

Thereafter a pre-metal nitride layer 1030 and pre-metal dielectric (PMD) layer 1040 can be deposited on the substrate 210. One or more interlevel dielectric layers (IDL) 1050 can then be deposited on the PMD layer 1040. As further illustrated, interconnects 1060 can be formed through the IDL layers 1050 and PMD layer 1040. The interconnects 1060 can include metal contacts, lines, single or dual damascene structures, comprising tungsten, copper, or other metals. Certain interconnects 1060 contact the metal silicide electrodes 1005 to thereby interconnect the active devices 205, 207 transistors to each other, or to other transistors of the integrated circuit. E.g., the active devices 205, 207 configured as nMOS and pMOS transistors, respectively, can be interconnected to form a complementary MOS (CMOS) device 1070. Analogous procedures can be conducted to complete the fabrication of the device embodiment depicted in FIG. 9.

FIG. 10 illustrates another embodiment of the disclosure, a semiconductor device 200. In this example, the device 200 is configured as an integrated circuit. The integrated circuit 200 can comprise one or more nMOS transistors 205 and pMOS transistors 207, located on or in the semiconductor substrate 210. In some embodiments, the nMOS and pMOS transistors 205, 207 are configured to form a semiconductor device 200 that is, or includes, a static random access memory (SRAM) device.

The nMOS transistors 205 include a gate dielectric layer 215 on the substrate 210, the gate dielectric layer 215 consisting essentially of a lanthanide silicon oxynitride layer 1020. That is, the lanthanide silicon oxynitride layer 1020 contains less than about 0.1 atomic percent of a transition metal element such as hafnium. The nMOS transistor 205 can also include various conventional components, such as a gate electrode 405 on the gate dielectric layer 215, and source and drain structures 1010 located adjacent to the gate dielectric layer 215.

As further illustrated in FIG. 10, the pMOS transistors 207 also include a second gate dielectric layer 1080 on the substrate 210. The second gate dielectric layer 1080 is substantially lanthanide-free. That is, the second gate dielectric layer 1080 of the pMOS transistors 207 has less than 0.1 atomic percent of a lanthanide element, such as ytterbium gadolinium, or dysprosium. In some cases, as illustrated in FIG. 10, the second gate dielectric layer 1080 comprises the nitrided silicon oxide layer 305. E.g., as discussed in the context of FIG. 1, lanthanide atoms 605 (FIG. 6) can be implanted into a nitrided silicon oxide layer 305 to form the lanthanide silicon oxynitride layer 1020 of the nMOS transistors 205, while the pMOS transistors 207 are masked, and hence are not implanted with lanthanide atoms.

The pMOS transistors 207 can also include various conventional components including a second gate electrode 1082 on the gate dielectric layer 1080, and second source and drain structures 1084 located adjacent to the gate dielectric layer 1080. In some cases, the second gate electrode 1082 and second source and drain structures 1084 are substantially the same as the gate electrode 405 and source and drain structures 1010 of the nMOS transistors 205. In other embodiments, the gate electrode 405 and second gate electrode 1082 are configured to have different work functions from each other. In some embodiments, the source and drain structures 1010 and second source and drain structures 1084 can both comprise doped silicon. In other embodiments, one or both of these structures 1010, 1084 can alternatively, or additionally, comprise strain producing materials (e.g., SiGe or SiC).

Those skilled in the art to which the disclosure relates will appreciate that other and further additions, deletions, substitutions, and modifications may be made to the described example embodiments, within the scope of the claimed invention.

What is claimed is:

1. A method for manufacturing a semiconductor device, comprising:
    forming a dielectric layer, including:
        forming a silicon oxide layer on a semiconductor substrate;
        nitriding the silicon oxide layer to form a nitrided silicon oxide layer; and
        incorporating lanthanide atoms into the nitrided silicon oxide layer to form a lanthanide silicon oxynitride layer;
    wherein incorporating the lanthanide atoms includes forming a lanthanide metal layer on the nitrided silicon oxide layer, and then annealing the lanthanide metal layer and the nitrided silicon oxide layer.

2. The method of claim 1, wherein forming the lanthanide metal layer includes depositing lanthanide metal at a deposition rate of about 0.5 nm per second.

3. The method of claim 1, wherein the anneal includes thermally annealing in an atmosphere having about 5 or more percent oxygen.

4. The method of claim 1, wherein the anneal is a thermal anneal also configured as a spike anneal that activates and diffuses implanted source and drain dopants.

5. A method for manufacturing a semiconductor device, comprising:
    forming a gate electrode over a gate dielectric, including:
        forming a silicon oxide layer on a semiconductor substrate;
        nitriding the silicon oxide layer to form a nitrided silicon oxide layer;
        forming a lanthanide metal layer on the nitrided silicon oxide layer;
        forming a gate electrode layer over the nitrided silicon oxide layer; and
        annealing the lanthanide metal layer and the nitrided silicon oxide layer to form a lanthanide silicon oxynitride layer.

6. The method of claim 5, wherein annealing the lanthanide metal layer and the nitrided silicon oxide layer comprises a thermal anneal performed prior to forming the gate electrode layer.

7. The method of claim 5, wherein annealing the lanthanide metal layer and the nitrided silicon oxide layer comprises a thermal anneal performed after forming the gate electrode layer.

8. The method of claim 5, wherein forming the gate electrode layer comprises forming a non-lanthanide metal layer over the gate dielectric layer; forming a barrier layer over the non-lanthanide metal layer; and forming a polysilicon layer over the barrier layer.

9. The method of claim 5, wherein annealing the lanthanide metal layer and the nitrided silicon oxide layer comprises performing a thermal anneal in an atmosphere having about 5 percent or higher oxygen.

10. The method of claim 5, further comprising implanting hafnium atoms into the nitrided silicon oxide layer.

11. The method of claim 10, wherein implanting the hafnium atoms includes implanting hafnium with a dosage of 5E14 to 5E15 atom/cm$^2$ at an implantation energy of about 20 to 40 keV.

* * * * *